(12) United States Patent
Aipperspach et al.

(10) Patent No.: US 7,725,844 B2
(45) Date of Patent: May 25, 2010

(54) METHOD AND CIRCUIT FOR IMPLEMENTING EFUSE SENSE AMPLIFIER VERIFICATION

(75) Inventors: Anthony Gus Aipperspach, Rochester, MN (US); Phil Christopher Felice Paone, Rochester, MN (US); Brian Joy Reed, Rochester, MN (US); David Edward Schmitt, Rochester, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 12/028,964

(22) Filed: Feb. 11, 2008

(65) Prior Publication Data

US 2009/0201074 A1    Aug. 13, 2009

(51) Int. Cl.
*G06F 17/50* (2006.01)
(52) U.S. Cl. .............................. 716/1; 326/38; 365/96; 365/225.7

(58) Field of Classification Search .................. 716/1; 326/38; 365/96, 225.7
See application file for complete search history.

(56) References Cited

U.S. PATENT DOCUMENTS

| 5,514,980 A * | 5/1996 | Pilling et al. ............... 326/38 |
| 6,876,594 B2 * | 4/2005 | Griesmer et al. ......... 365/225.7 |
| 7,136,322 B2 * | 11/2006 | Brennan et al. .......... 365/225.7 |
| 2009/0175106 A1 * | 7/2009 | Aipperspach et al. ....... 365/201 |
| 2009/0201756 A1 * | 8/2009 | Aipperspach et al. ....... 365/205 |
| 2009/0262566 A1 * | 10/2009 | Kurjanowicz ................ 365/96 |

\* cited by examiner

*Primary Examiner*—Naum B Levin
(74) *Attorney, Agent, or Firm*—Joan Pennington

(57) ABSTRACT

A method and circuit for implementing Efuse sense amplifier verification, and a design structure on which the subject circuit resides are provided. A first predefined resistor value is sensed relative to a reference resistor. A second predefined resistor value is sensed relative to a reference resistor. Responsive to identifying a respective sense amplifier output resulting from the sensing steps of an unblown eFuse and a blown eFuse, valid operation of the sense amplifier is identified.

12 Claims, 4 Drawing Sheets

METHOD AND CIRCUIT FOR IMPLEMENTING EFUSE SENSE AMPLIFIER VERIFICATION

FIELD OF THE INVENTION

The present invention relates generally to the data processing field, and more particularly, relates to a method and circuit for implementing Efuse sense amplifier verification, and a design structure on which the subject circuit resides.

DESCRIPTION OF THE RELATED ART

Electronic Fuses (eFuses) are currently used to configure elements after the silicon masking and fabrication process. These fuses typically are used to configure circuits for customization or to correct silicon manufacturing defects and increase manufacturing yield.

In very large scale integrated (VLSI) chips, it is common to have fuses, such as eFuses that can be programmed for various reasons. Among these reasons include invoking redundant elements in memory arrays for repairing failing locations or programming identification information.

When a fuse is sensed, both the sense amplifier and the blown fuse resistance must be within the specification to ensure the proper value is read out. Currently, when testing fuse hardware in the lab, it is difficult to discern the difference between a malfunctioning sense amplifier and an improperly blown fuse. Typically the way to verify a sense amplifier is within specification is to blow a fuse with a resistance equal to that of the smallest resistance the sense amplifier is specified to read as blown.

The problem with this way of verifying the sense amplifier is that blowing a fuse with such exact resistance is extremely difficult. Fuses are designed to introduce extremely high resistances to the path when blown. Only a small fraction of the fuses will equal the small resistance needed for effective sense amplifier testing. It is quite likely no fuses will have the specific value needed. When this happens, it is impossible to verify the sense amplifier is in specification.

A need exists for an effective mechanism for verification of a sense amplifier.

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

SUMMARY OF THE INVENTION

Principal aspects of the present invention are to provide a method and circuit for implementing Efuse sense amplifier verification, and a design structure on which the subject circuit resides. Other important aspects of the present invention are to provide such method and circuit for implementing Efuse sense amplifier verification substantially without negative effect and that overcome many of the disadvantages of prior art arrangements.

In brief, a method and circuit for implementing Efuse sense amplifier verification, and a design structure on which the subject circuit resides are provided. A first predefined resistor value is sensed relative to a reference resistor. A second predefined resistor value is sensed relative to a reference resistor. Responsive to identifying a respective sense amplifier output resulting from the sensing steps of an unblown eFuse and a blown eFuse, valid operation of the sense amplifier is identified.

In accordance with features of the invention, the sense amplifier is responsive to failing to identify a respective sense amplifier output of an unblown eFuse and a blown eFuse for identifying out-of-specification sense amplifier operation. A respective select transistor is connected to each eFuse, and a control signal is applied to the respective select transistors for disconnecting each eFuse from the sense amplifier. The first predefined resistor corresponds to a predefined unblown eFuse resistance and the second predefined resistor corresponds to a predefined blown eFuse value.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and circuit for implementing sense amplifier verification to enable quickly and accurately determining if an sense amplifier is operating within a defined specification to enable accurately identifying the difference between an unblown fuse and a blown fuse.

Figure 1:
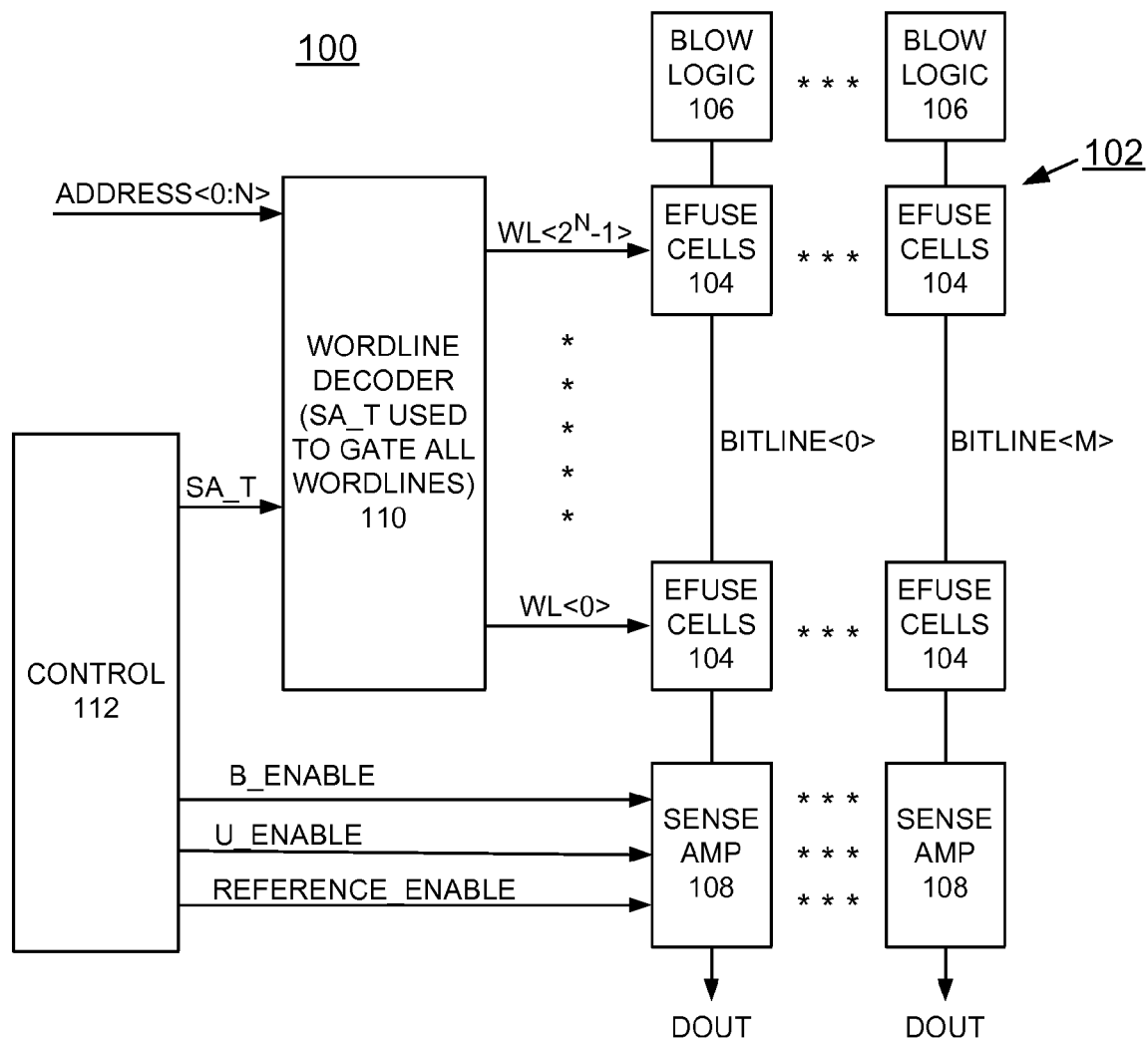
FIG. 1 is a schematic diagram illustrating an exemplary circuit for implementing sense amplifier verification in accordance with the preferred embodiment.

Having reference now to the drawings, in FIG. 1, there is shown an exemplary circuit for implementing eFuse sense amplifier verification generally designated by the reference character 100 in accordance with the preferred embodiment. Sense amplifier verification circuit 100 includes an eFuse array 102 including a plurality of eFuse cells 104. Sense amplifier verification circuit 100 includes an eFuse array 102 including a plurality of eFuse cells 104 with multiple or $2^N-1$ eFuse cells 104 connected to each bitline of a plurality of bitlines 0-M. The eFuse array 102 contains X number of eFuse cells 104, where X equals the number of wordlines (or $2^N-1$) multiplied by the number of bit lines. Sense amplifier verification circuit 100 includes fuse blow logic 106 and a sense amplifier 108 associated with each bitline 0-M. Sense amplifier verification circuit 100 includes a wordline decoder 110 for addressing a wordline input to the multiple eFuse cells 104 connected to each bitline.

In accordance with features of the invention, a control function or circuit 112 generates a plurality of control signals B_ENABLE, U_ENABLE, and REFERENCE_ENABLE that are applied to the sense amplifier 108 for implementing eFuse sense amplifier verification in accordance with the preferred embodiment. Two resistors are provided in accordance with features of the invention, one of resistance U to impersonate an unblown fuse and one of resistance B to impersonate a blown fuse. U_ENABLE and B_ENABLE signals select the fuse impersonating resistors. REFERENCE_ENABLE is used to select the reference resistor.

In accordance with features of the invention, the control function 112 generates a control signal SA_T that is applied to the wordline decoder 110 for implementing eFuse sense amplifier verification in accordance with the preferred embodiment. The control signal SA_T is provided to deactivate all the word lines so no eFuses are connected to the bitline and then a selected resistor of value U or B is activate in its place. The control signal SA_T deactivates the word lines.

Figure 2A:
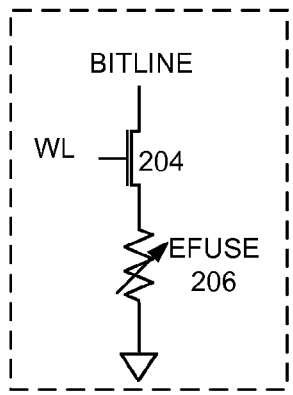
FIGS. 2A and 2B are schematic diagrams respectively illustrating an exemplary eFuse cell and exemplary sense amplifier of the circuit of FIG. 1 for implementing sense amplifier verification in accordance with the preferred embodiment.

FIG. 2A illustrates an exemplary eFuse cell 104 of the sense amplifier verification circuit 100. Each fuse cell 104 includes a respective NFET 204 connected in series with an eFuse 206 connected between a bitline and connected via ground. A respective wordline input WL is applied to a gate input of each NFET 204.

Figure 2B:
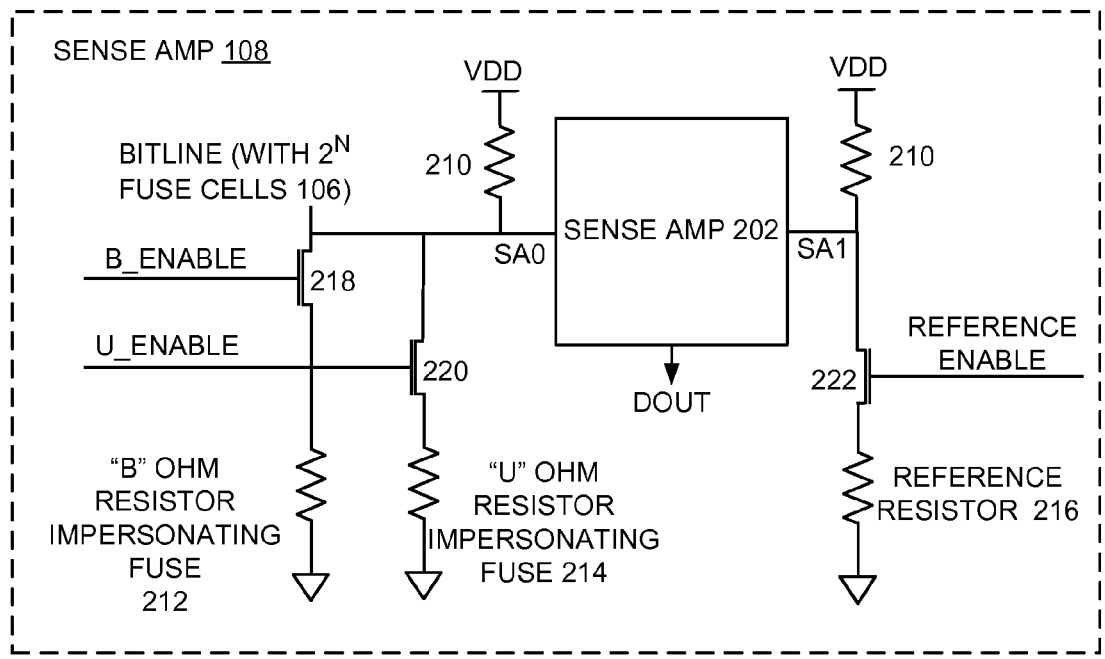

FIG. 2B illustrates an exemplary sense amplifier 108 for implementing eFuse sense amplifier verification in accordance with the preferred embodiment. Sense amplifier 108 includes a sense amplifier circuit 202 used for an electronic fuse, or eFuse cell 102 to determine if the eFuse 206 is a blown or an unblown fuse, for example, providing an output DOUT of a logical "0" or logical "1". Sense amplifier 108 includes a pair of respective resistor pull-up devices 210 connected between a positive voltage supply rail VDD and a first sensing node SA0 and a second sensing node SA1. Sense amplifier 108 includes a pair of respective resistors 212, 214 coupled to the first sensing node SA0, one resistor 212 having a first resistance B to impersonate a blown fuse and one resistor 214 having a second resistance U to impersonate an unblown fuse. Sense amplifier 108 includes a reference resistor 216 coupled to the second sensing node SA1. A respective N-channel field effect transistor (NFET) 218, 220, 222 is connected between the resistors 212, 214, 216 and the first sensing node SA0, and the second sensing node SA1. A respective one of the control signals B_ENABLE, U_ENABLE, and REFERENCE_ENABLE is applied to a gate input of the respective NFETs 218, 220, 222 to select the B ohm resistor 212, U ohm resistor 214, and the reference resistor 216.

As shown in FIGS. 1, 2A, and 2B, each of the eFuse cells 104 on a bitline shares a sense amplifier 108. The number of sense amplifiers 108 equals the number of bitlines 0-M. When performing a sensing operation, each sense amplifier 108 will contribute one bit to the fuse data on the output bus. In normal operation one wordline WL and one reference resistor 216 is selected. This connects one eFuse 206 and one reference resistor 216 per bitline to its corresponding sense amplifier 108, which creates a respective voltage divider between one pull-up resistor 210 and the selected reference resistor 216 and the other pull-up resistor 210 and the selected eFuse 206. The s sense amplifier circuit 202 evaluates the difference between the two voltage dividers and consequently determines if the selected eFuse 206 has a larger or smaller resistance compared to the reference resistor 216. To determine the difference between an unblown fuse and a blown fuse, the reference resistor 216 has a resistance higher than an unblown fuse but lower then a blown fuse.

The method for implementing sense amplifier verification in accordance with the preferred embodiment includes two sensing operations. One sensing operation is completed, for example, with SA_T=1, U_ENABLE=1, B_ENABLE=0, and REFERENCE_ENABLE=1. This operation includes a voltage divider between the pull-up resistor 210 and the selected U ohm resistor 214 connected to node SA0 and a voltage divider between the other pull-up resistor 210 and the selected reference resistor 216 connected to node SA1. Sense amplifier circuit 202 evaluates the difference between the two voltage dividers and determines if the U ohm resistor 214 has a larger or smaller resistance compared to the reference resistor 216 to detect either an unblown fuse or a blown fuse. If DOUT shows that the fuse is unblown, then this first sensing operation of the sense amplifier 108 shows operation within specification to validate this operation of the sense amplifier. A second sensing operation is then completed with SA_T=1, U_ENABLE=0, B_ENABLE=1, and REFERENCE_ENABLE=1. This operation includes a voltage divider between the pull-up resistor 210 and the selected B ohm resistor 212 connected to node SA0 and a voltage divider between the other pull-up resistor 210 and the selected reference resistor 216 connected to node SA1. If DOUT also shows that the fuse is blown, the operation of the sense amplifier 108 is completely validated.

Figure 3:
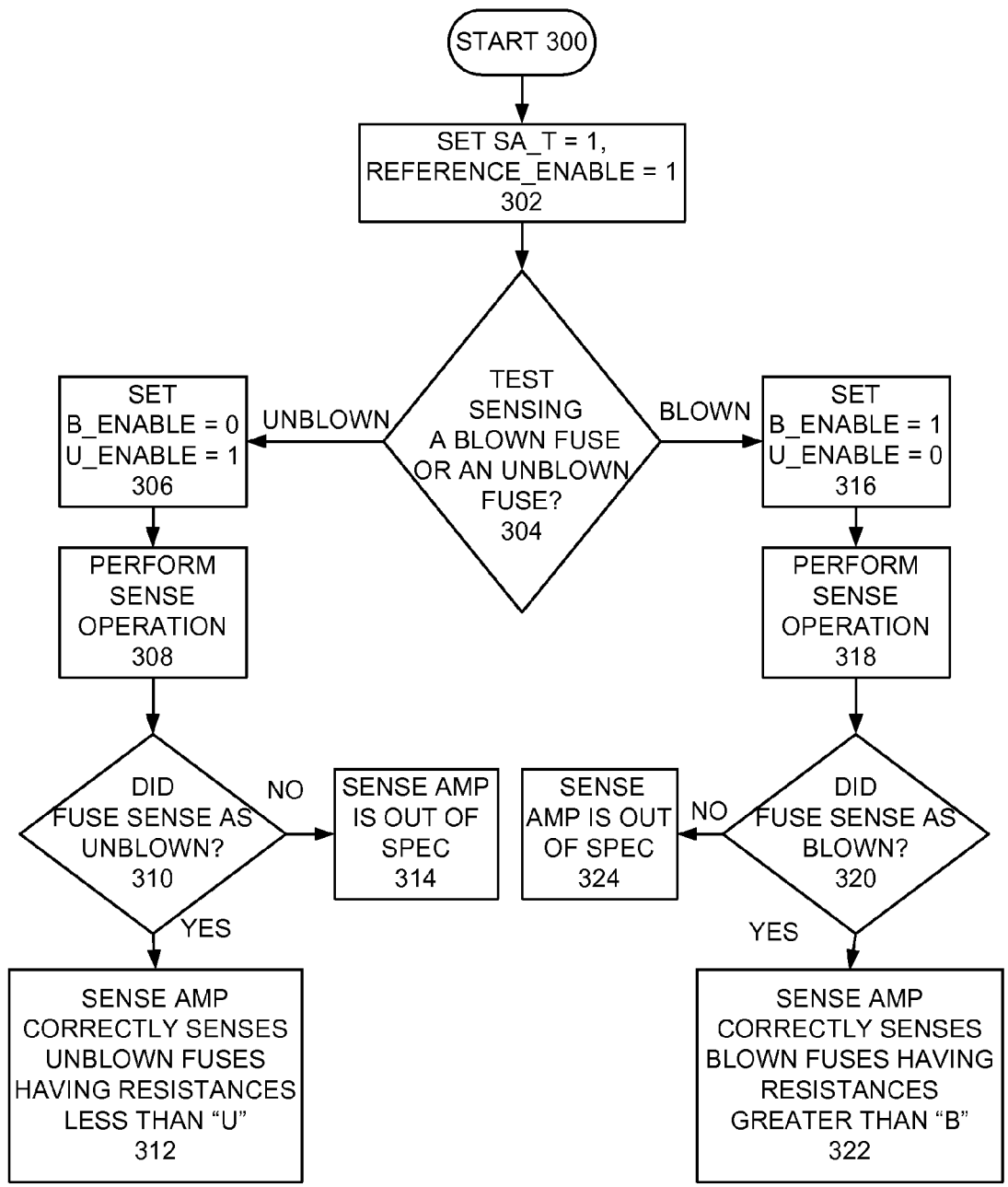
FIG. 3 illustrates exemplary steps for implementing eFuse sense amplifier verification in accordance with the preferred embodiment.

Referring also to FIG. 3, there are shown exemplary steps for implementing sense amplifier verification in accordance with the preferred embodiment starting at a block 300. As indicated at a block 302, the control signals are set to SA_T=1, and REFERENCE_ENABLE=1, to deactivate all eFuse cells 104 with the wordlines gated and to select the reference resistor 216. As indicated at a decision block 304, it is determined to test sensing a blown fuse or an unblown fuse operation. When testing an unblown fuse, then the control signals are set to U_ENABLE=1, B_ENABLE=0 as indicated at a block 306. Then a sense operation is performed as indicated at a block 308. Checking whether the fuse sensed as unblown is performed as indicated at a decision block 310. If the sensed output DOUT shows that the fuse is unblown, then this first sensing operation of the sense amplifier 108 shows operation within specification as indicated at a block 312. Otherwise if the sensed output DOUT shows that the fuse is blown, then the sense amplifier is out of specification and fails as indicated at a block 314.

When testing to verify a blown fuse operation, then the control signals are set to U_ENABLE=0, B_ENABLE=1 as indicated at a block 316. Then a sense operation is performed as indicated at a block 318. Checking whether the fuse sensed as blown is performed as indicated at a decision block 320. If the sensed output DOUT shows that the fuse is blown, then this second sensing operation of the sense amplifier 108 shows operation within specification as indicated at a block 322. Otherwise if the sensed output DOUT shows that the fuse is unblown, then the sense amplifier is out of specification and fails as indicated at a block 324.

Figure 4:
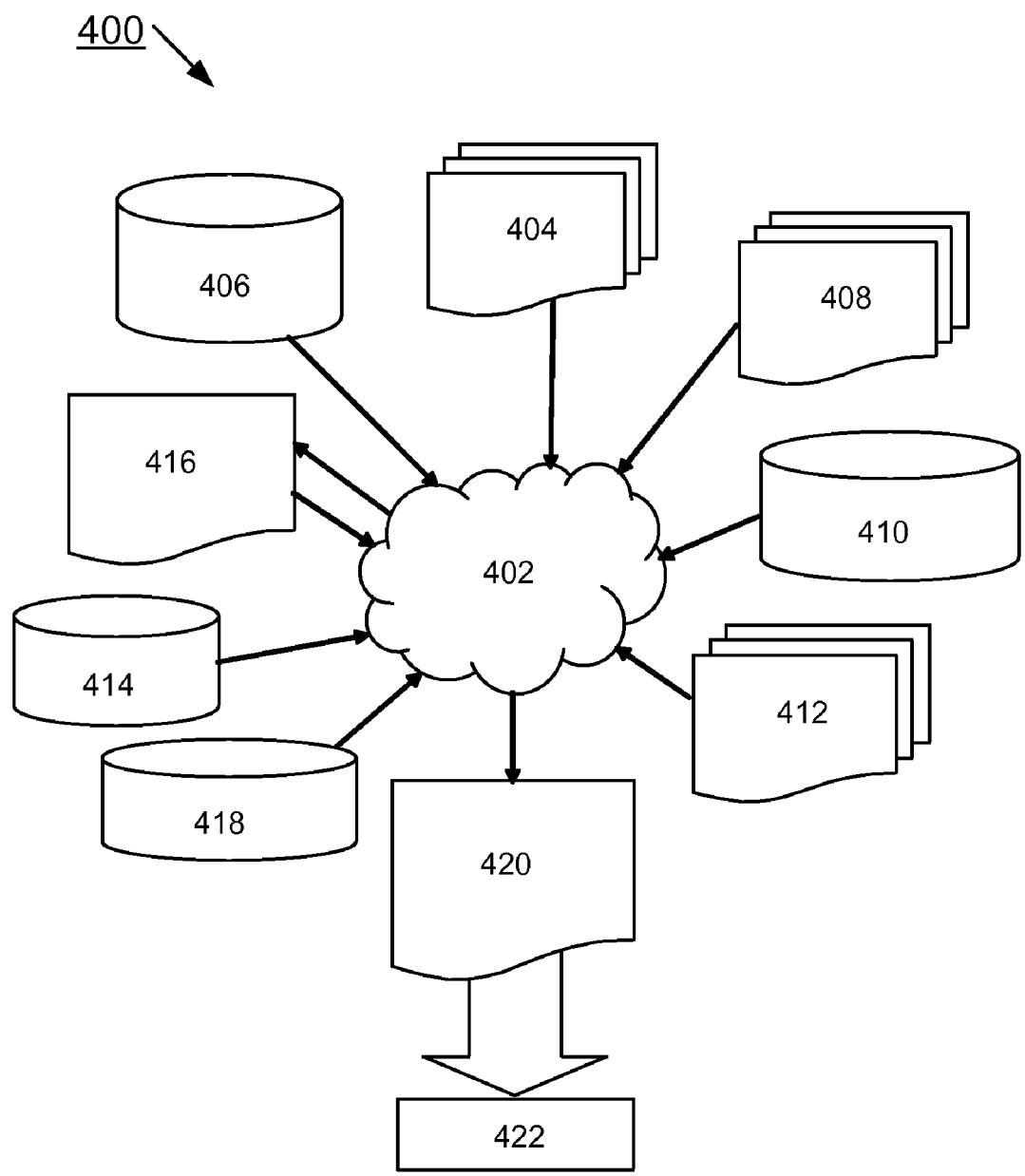
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuits 100, 104, 108 in the form of schematics or HDL, a hardware-description language, for example, Verilog, VHDL, C, and the like. Design structure 402 may be contained on one or more machine readable medium. For example, design structure 402 may be a text file or a graphical representation of circuit 100. Design process 404 preferably synthesizes, or translates, circuits 100, 104, 108 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1, 2A, 2B, and 3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A, 2B, and 3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing sense amplifier verification comprising:
   a sense amplifier;
   a first pull-up resistor connected between a positive voltage supply rail and a first sensing node of the sense amplifier;
   a second pull-up resistor connected between a positive voltage supply rail and a second sensing node of the sense amplifier;
   a first predefined resistor and a second predefined resistor coupled to the first sensing node; said first predefined resistor having a first resistance to impersonate a blown fuse and said second predefined resistor having a second resistance to impersonate an unblown fuse;
   a reference resistor coupled to the second sensing node;
   a first control transistor connected between said first predefined resistor and the first sensing node;
   a second control transistor connected between said second predefined resistor and the first sensing node;
   a reference control transistor connected between said reference resistor and the second sensing node;
   a first control signal applied to said first control transistor to connect said first predefined resistor to the first sensing node, and a reference control signal applied to said reference control transistor to connect said reference resistor to the second sensing node for sensing said first predefined resistor relative to said reference resistor;
   a second control signal applied to said second control transistor to connect said second predefined resistor to the first sensing node, and said reference control signal applied to said reference control transistor to connect said reference resistor to the second sensing node for sensing said second predefined resistor relative to said reference resistor; and
   the sense amplifier responsive to identifying a respective sense amplifier output of an unblown eFuse and a blown eFuse, identifying valid sense amplifier operation.

2. The circuit for implementing sense amplifier verification as recited in claim 1 includes the sense amplifier responsive to failing to identify a respective sense amplifier output of an unblown eFuse and a blown eFuse, identifying out-of-specification sense amplifier operation.

3. The circuit for implementing sense amplifier verification as recited in claim 1 includes a respective select transistor connected to each eFuse, and a control signal applied to said respective select transistor for disconnecting each eFuse from the sense amplifier.

4. The circuit for implementing sense amplifier verification as recited in claim 1 wherein said first predefined resistor corresponds to a predefined unblown eFuse resistance and said second predefined resistor corresponds to a predefined blown eFuse value.

5. The circuit for implementing sense amplifier verification as recited in claim 4 wherein said first predefined resistor corresponding to said predefined unblown eFuse resistance is less than said reference resistor; and said second predefined resistor corresponding to said predefined blown eFuse value is greater than said reference resistor.

6. A design structure embodied in a machine readable storage device used in a design process, the design structure comprising:
   a circuit for implementing sense amplifier verification including a sense amplifier;
   a first pull-up resistor connected between a positive voltage supply rail and a first sensing node of the sense amplifier;
   a second pull-up resistor connected between a positive voltage supply rail and a second sensing node of the sense amplifier;
   a first predefined resistor and a second predefined resistor coupled to the first sensing node; said first predefined resistor having a first resistance to impersonate a blown fuse and said second predefined resistor having a second resistance to impersonate an unblown fuse;
   a reference resistor coupled to the second sensing node;
   a first control transistor connected between said first predefined resistor and the first sensing node;
   a second control transistor connected between said second predefined resistor and the first sensing node;
   a reference control transistor connected between said reference resistor and the second sensing node;
   a first control signal applied to said first control transistor to connect said first predefined resistor to the first sensing node, and a reference control signal applied to said reference control transistor to connect said reference resistor to the second sensing node for sensing said first predefined resistor relative to said reference resistor;
   a second control signal applied to said second control transistor to connect said second predefined resistor to the first sensing node, and said reference control signal applied to said reference control transistor to connect said reference resistor to the second sensing node for sensing said second predefined resistor relative to said reference resistor; and the sense amplifier responsive to identifying a respective sense amplifier output of an unblown eFuse and a blown eFuse, identifying valid sense amplifier operation.

7. The design structure of claim 6, wherein the design structure comprises a netlist, which describes the circuit.

8. The design structure of claim 6, wherein the design structure resides on storage medium as a data format used for the exchange of layout data of integrated circuits.

9. The design structure of claim 6, wherein the design structure includes at least one of test data files, characterization data, verification data, or design specifications.

10. The design structure of claim 6, includes the sense amplifier responsive to failing to identify a respective sense amplifier output of an unblown eFuse and a blown eFuse, identifying out-of-specification sense amplifier operation.

11. The design structure of claim 6, includes a respective select transistor connected to each eFuse, and a control signal applied to said respective select transistor for disconnecting each eFuse from the sense amplifier.

12. The design structure of claim 6, wherein said first predefined resistor corresponds to a predefined unblown eFuse resistance and said second predefined resistor corresponds to a predefined blown eFuse value.

* * * * *